United States Patent [19]

Goy et al.

[11] Patent Number: 5,762,768
[45] Date of Patent: Jun. 9, 1998

[54] TARGET FOR CATHODIC SPUTTERING AND METHOD FOR PRODUCING THE TARGET

[75] Inventors: Karl-Heinz Goy; David Francis Lupton, both of Gelnhausen; Jörg Schielke, Bruchköbel; Friedhold Schölz, Rodenbach, all of Germany; Bernard Serole, Peyrins, France; Hans Bohmeier, Freiberg, Germany

[73] Assignee: W.C. Heraeus GmbH, Germany

[21] Appl. No.: 693,988

[22] Filed: Aug. 8, 1996

[30] Foreign Application Priority Data

Aug. 18, 1995 [DE] Germany ............ 195 30 364.4
Oct. 30, 1995 [DE] Germany ............ 195 40 379.7

[51] Int. Cl.$^6$ ............ C04B 35/46; C23C 14/34
[52] U.S. Cl. ............ 204/298.13; 75/234; 204/192.29; 501/134; 419/19; 419/31; 419/42; 419/49
[58] Field of Search ............ 204/192.29, 298.13; 75/234; 501/134; 419/19, 31, 42, 49

[56] References Cited

U.S. PATENT DOCUMENTS

| | | | |
|---|---|---|---|
| 4,647,548 | 3/1987 | Klein | 501/134 |
| 5,435,826 | 7/1995 | Sakakibara et al. | 75/232 |
| 5,480,531 | 1/1996 | Weigert et al. | 204/298.13 |

FOREIGN PATENT DOCUMENTS

| | | | |
|---|---|---|---|
| 44 07 744 C1 | 4/1995 | Germany | 204/298.13 |
| 44 27 060 C1 | 11/1995 | Germany | |
| 60-130008 | 7/1985 | Japan | 204/192.29 |

OTHER PUBLICATIONS

Patent Abstracts of Japan, vol. 014, No. 382 (1990) of JP-A-02 141459.
Patent Abstracts of Japan, vol. 012, No. 482 (1988) of JP-A-63 199862.
Patent Abstracts of Japan, vol. 017, No. 678 (1993) of JP-A-05 222526.

*Primary Examiner*—Aaron Weisstuch
*Attorney, Agent, or Firm*—Frishauf, Holtz, Goodman, Langer & Chick, P.C.

[57] ABSTRACT

The targets for cathodic sputtering according to this invention are formed of hot-pressed or hot isostatic-pressed indium oxide/tin oxide powder with a minimum density of 95% of the theoretical density and with a sub-stoichiometric oxygen content are known. In order to provide the improvement of high stability and, simultaneously, high sputtering rate, it is proposed according to the invention that the target have a crystalline phase which is formed as a solid solution of indium oxide and tin oxide with a minimum of 90% by weight, preferably a minimum of 97%, of the solid solution, and which has an average grain size ranging from 2 μm to 20 μm. In order to make available a simple and cost-efficient method for producing a target consisting of a starting powder of indium oxide/tin oxide, which allows for a precise setting of the oxygen content and a homogeneous chemical composition throughout the entire target volume, it is proposed that a starting powder be used that is produced by oxidizing finely distributed indium tin metal.

22 Claims, 2 Drawing Sheets

TARGET FOR CATHODIC SPUTTERING AND METHOD FOR PRODUCING THE TARGET

BACKGROUND OF THE DISCLOSURE

The invention relates to an improved target for cathodic sputtering of the type formed of hot-pressed or hot isostatic-pressed indium oxide/tin oxide powder with a minimum density of 95% of its theoretical density, and with a sub-stoichiometric oxygen content.

The targets of this type are used, for example, in the manufacture of thin layers of indium tin oxide. These so-called ITO layers are superior due to their transparency and their electrical conductivity. They are, for example, used in the manufacture of liquid crystal displays. A composition of ITO layers which contains approximately 90% by weight of indium oxide and approximately 10% by weight of tin oxide has proven the most successful.

A target of this kind is known from DE-C1 44 07 774. In the oxide ceramic matrix of the target, metallic phase particles with sizes less than 50 µm are embedded with a uniform distribution. The target has a density exceeding 96% of the theoretical density of the corresponding fully oxidic material.

The invention has the objective of specifying a target which is superior both in its high stability and high sputtering rate.

Furthermore, the invention pertains to a method for producing a target for cathodic sputtering by making available an indium oxide/tin oxide starting powder and compressing the starting powder through hot-pressing or hot isostatic-pressing. Such a method is also known from DE-C1 44 07 774. It is therein suggested that a powder of indium oxide and tin oxide be heated to glowing in a reducing atmosphere, in order to obtain a degree of reduction of approximately 0.02 to 0.2. In this context, the degree of reduction is defined as the loss of oxygen during said reduction treatment in comparison to the oxygen content of the fully oxidic powder. By means of the reduction treatment, a powder with spherical metal phases measuring 1 to 10 µm was produced, whose tin content exceeds 90% by weight. The powder produced in this fashion was pre-pressed in a cylinder and subsequently hot isostatic-compacted in a steel container at approximately 800° C. and at a pressure of 20 MPa.

The suggested method is relatively work-intensive. The treatment in a reducing atmosphere requires the availability of suitable reducing agents, such as a forming gas, and, as a result, is also relatively expensive. The precise control of the oxygen content demands the utmost care. The control of a uniform degree of reduction throughout the entire target volume as well as the high tin content of the metal phase are also particularly problematic.

The invention thus has the additional objective of providing a simple and cost-efficient method for producing a target which allows for a precise control of the oxygen content and a homogeneous chemical composition throughout the entire target volume.

SUMMARY OF THE DISCLOSURE

The targets for cathodic sputtering according to this invention, formed of hot-pressed or hot isostatic-pressed indium oxide/tin oxide powder with a minimum density of 95% of the theoretical density and with a sub-stoichiometric oxygen content, are known. In order to provide the improvement of high stability and, simultaneously, high sputtering rate, it is proposed according to the invention that the target have a minimum of 90% by weight, preferably a minimum of 97% by weight of a crystalline phase which is formed as a solid solution of indium oxide and tin oxide and which has an average grain size ranging from 2 µm to 20 µm. In order to make available a simple and cost-efficient method for producing a target consisting of a starting powder of indium oxide/tin oxide, which allows for a precise control of the oxygen content and a homogeneous chemical composition throughout the entire target volume, a starting powder is used that is produced by oxidizing finely distributed indium tin metal.

DETAILED DESCRIPTION OF THE INVENTION

Figure 1:
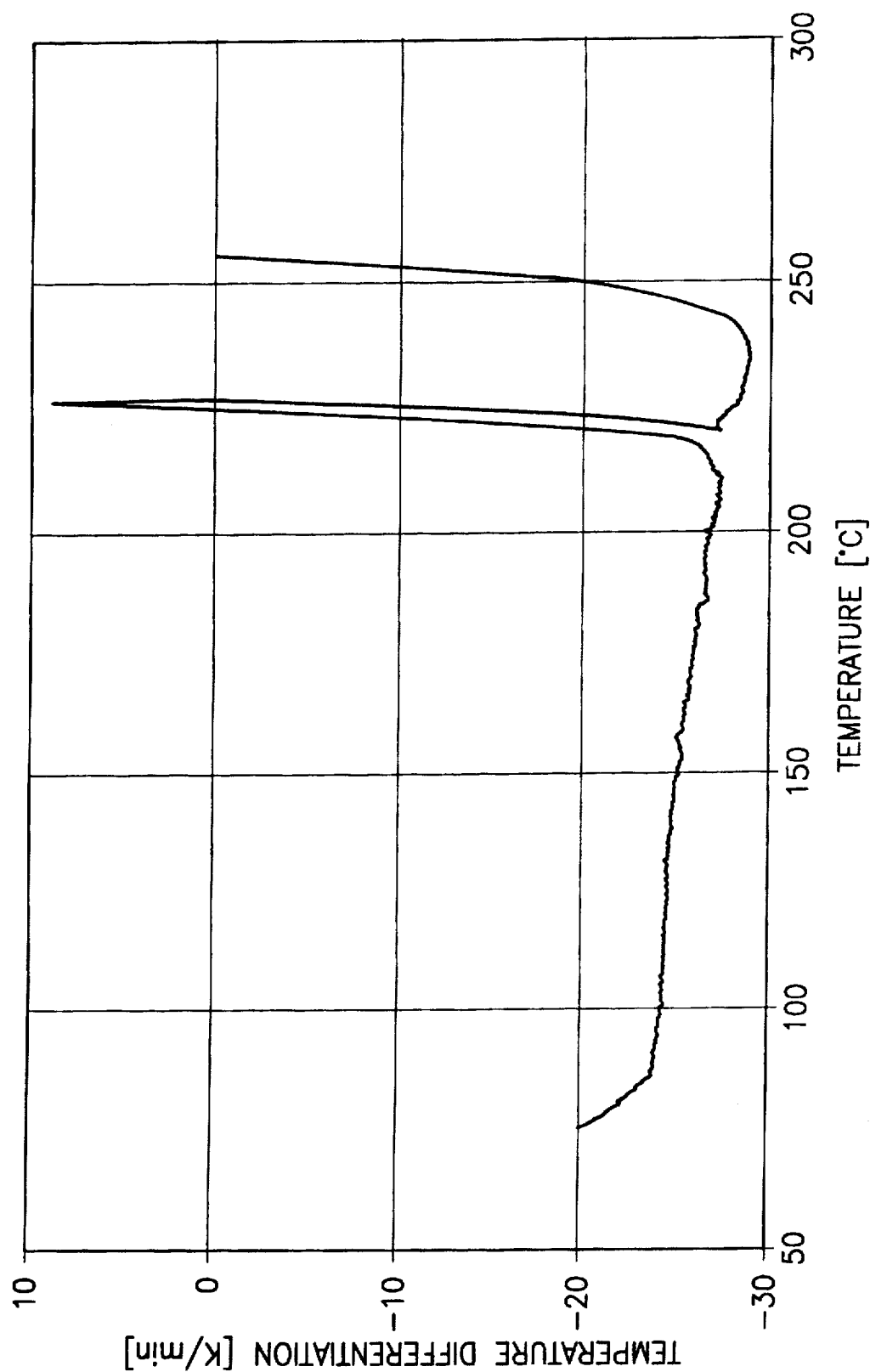
FIG. 1 is a differential thermal analysis (DTA) of oxidic and subsequently forming-gas reduced indium tin solid solution powder.

The targets of the present invention are made by sintering indium oxide/tin oxide powder mixtures. It has been determined that with a grain size coarser than 20 µm the sputtering target becomes brittle, and that with a grain finer than 2 µm the otainable sputtering rate is low. Due to the fact that the oxide particles are present as a solid solution, a particularly homogeneous distribution of indium and tin is ensured. This facilitates the production of uniform, homogeneous ITO layers from the target according to the invention. Moreover, the homogeneous, substantially single-phase crystalline structure improves the breaking strength of the target. Additionally, the single-phase solid solution structure enables the production of ITO layers with high electrical conductivity. The favorable impact of these effects is directly proportionate to the amount of the solid solution phase in the target. The effects, however, are only significant starting at a minimum of 90% by weight.

A target that has proven particularly advantageous is one in which the solid solution phase is produced by hot-pressing or hot isostatic-pressing indium oxide/tin oxide powder particles which possess an oxygen content that decreases from the outside to the inside. To meet the requirement of decreasing oxygen content from the outside to the center of the particles, it is not necessary for the oxygen content to decrease continuously, e.g. the oxygen content can decrease continuously or the powder particles can possess an oxidic outer skin or shell which encloses a metallic core. Dense sintering of such powder particles is particularly easy. In this case, a preferred embodiment of the target is one in which the solid solution has the molecular lattice of indium oxide.

A suitable solid solution phase is described in greater detail in the older German patent application DE 44 27 060, to which express reference is made herewith, particularly with respect to x-ray diffraction measurements.

It is advantageous that the powder particles have a metallic phase whose indium content is a minimum of 50% by weight. Thus the indium percentage exceeds the tin percentage in the metallic phase. This is also the case with standard ITO compositions, for example, with a mixture ratio of indium oxide:tin oxide of 90:10. Compared to the targets known from the state of the art with a metallic phase rich in tin, the powder particles with such a metallic phase rich in indium are thus particularly superior due to the fact that their chemical composition corresponds more to that of the oxidic phase. This ensures a homogeneous distribution of tin and indium throughout the entire volume of the target.

In a preferred embodiment of the target according to the invention, the chemical composition of the metallic phase rich in indium—aside from the oxygen content—approximates that of the crystal phase as much as possible. This is the case, for example, with a crystalline phase composition of indium oxide:tin oxide of 90:10, with a percentage of indium in the metallic phase ranging between 50% by weight and 90% by weight.

With respect to the method, the above-stated objective, proceeding from the aforementioned method, is met according to the invention by the fact that the starting powder is produced by oxidizing finely distributed indium-tin-metal. In the method according to the invention, a finely distributed metal corresponding to the desired composition of indium and tin is produced and subsequently oxidized. Since indium and tin are uniformly distributed in the metal according to the concentration ratio to be set, the starting powder produced from that also has a homogeneous composition.

The oxygen content of the starting powder can be very easily varied and precisely set through the degree of the oxidation treatment. In this manner, starting powders with stoichiometric as well as sub-stoichiometric oxygen content can be obtained. A subsequent oxidation or reduction treatment of the target during sintering can thus be omitted in the method according to the invention. However, the method according to the invention does not aim expressly and exclusively at the prevention of a subsequent oxidation or reduction treatment. In cases where such an additional after-treatment is considered suitable, it is, at any rate, facilitated due to the use of starting powders with a pre-set degree of oxidation.

Furthermore, the method according to the invention provides for a precise setting of the oxygen content throughout the entire target volume. The oxygen content of the individual powder particles can be set precisely. In a fine-particle powder, any oxygen distribution in the target can be obtained through an appropriate distribution of the powder. If, for example, the oxygen content—from a macroscopic perspective—is to be constant in the target volume, a starting powder with the corresponding equivalent oxygen content is compressed in the powder particles. Generally, a larger block is sintered from the starting powder from which several targets can then be produced.

A method is preferred in which the starting powder is produced by atomizing an indium-tin-metal melt in an oxidizing atmosphere. In this method which, in the following, is called co-oxidation, an indium tin melt is finely atomized and burnt in an oxygen-containing atmosphere. For this, the oxygen present in the air is sufficient; nevertheless, the air can also be enriched with oxygen. In this manner, a solid solution powder generally results, which is not fully oxidized and in which a sub-stoichiometric oxide or metallic phase can be present. In the starting powder produced in this fashion, it is possible that the outside of the powder particles may contain a higher oxygen content than inside. This can occur to the extent that the powder particles are oxidized outside and have a metallic phase inside. The metallic phase in such a solid solution powder is distributed particularly uniformly.

The use of a starting powder with sub-stoichiometric oxygen content has proven particularly successful. A powder of this type can undergo further processing without an additional reduction treatment, by hot-pressing or hot isostatic-pressing. A costly, subsequent reduction treatment of the target during sintering can thus be omitted with the method according to the invention. It has been shown that starting powders which are not fully oxidized do not require an exact adherence to the reduction and/or oxidation conditions during hot-pressing or hot isostatic-pressing, but that a certain latitude exists. In this connection, the oxygen content of the starting powder can be so low that in those targets produced from it, metallic indium and/or tin in finely distributed form is present.

The oxygen content of the starting powder is determined by means of the so-called "hot extraction method." Here a precisely weighed quantity of the starting powder or a pulverized target material, respectively, is heated in a graphite crucible and the oxygen which is thus set free in the form of carbon monoxide or carbon dioxide is measured.

A method has proven particularly advantageous in which the powder particles of the starting powder have an oxygen content which decreases from outside to inside. In this connection, the oxygen content can, for example, decrease continuously, or the powder particles can have an oxidic shell or skin which surrounds a core of a metallic phase. In each case, a metallic phase or sub-stoichiometric oxide accumulates equally in each individual powder particle. As a result, the oxygen present in the compacts produced from the powder particles is distributed uniformly.

It has been shown that such starting powders are relatively immune to the changes in the sintering atmosphere and can undergo dense sintering particularly easily. It can be assumed that the oxidic shell prevents or slows down an additional oxidation of the powder particles, so that sintering of the powder particles is made possible in air, for example, without significantly influencing the pre-set degree of oxidation of the powder particles or target, respectively. When sintering, a fluid metallic phase can result from the starting powder, which, after sintering, can assume any desired configuration in the target. At any rate, the method according to the invention facilitates a uniform distribution of such a metallic phase.

A method has proven particularly favorable in which a starting powder is used which has a metallic phase whose indium content is a minimum of 50% by weight. In this starting powder, the indium percentage exceeds the tin percentage in the metallic phase. This is also the case with standard ITO compositions, for example, with a mixing ratio of indium oxide:tin oxide of 90:10. Compared to targets with a metallic phase rich in tin known from the state of the art, the powder particles with such a metallic phase rich in indium are thus superior, particularly because their chemical composition approximates more closely that of the oxidic phase or even corresponds to it. This ensures a homogeneous distribution of tin and indium throughout the entire target volume, and, in fact, also in the metallic phase, corresponding to the given indium oxide-tin oxide concentration ratio. This can be achieved by means of the above mentioned "co-oxidation method." Since no chemical equilibrium generally results when an indium-tin metal is atomized, the composition of the metallic phase obtained in the powder corresponds rather to that of the metal melt and not necessarily to what would be expected under equilibrium conditions on the basis of the thermodynamics.

In a preferred embodiment of the method according to the invention, the chemical composition of the metallic phase rich in indium—aside from the oxygen content—approximates that of the crystal phase as much as possible. This is the case, for example, with a crystalline phase composition of indium oxide:tin oxide of 90:10, with an indium percentage in the metallic phase ranging between 50% by weight and 90% by weight.

The dense sintering is further simplified if the starting powder has an average particle size ranging from 2 μm to 20 μm. By means of such a fine-particle starting powder, an equally fine-particle and uniform distribution of the oxygen and the available metallic phase is achieved throughout the entire target volume. In this situation, it is also particularly advantageous to use a starting powder with as narrow a particle-size distribution as possible. Starting powders in which the size of 90% of the powder particles deviates a maximum of 50% from the average particle size have proven successful.

A method has proven particularly successful whereby the target is produced from a starting powder whose percentage of solid solution phase is present in the molecular lattice of indium oxide. This ensures a particularly homogeneous distribution of indium and tin, which facilitates the producing of uniform, homogeneous ITO layers from the target according to the invention. The homogeneous, essentially single-phase crystalline structure also improves the breaking strength of the target. The favorable impact of these effects is directly proportionate to the percentage increase of the solid solution phase in the target. The effects, however, have only been observed starting at a minimum of 90% by weight. It is particularly easy to obtain the solid solution phase through the above described co-oxidation process.

The hot-pressing or hot isostatic-pressing of the starting powder is preferably carried out at low temperatures ranging between 800° C. and 1,050° C. At these temperatures, a dense sintering of the starting powder takes place. At higher sintering temperatures, there is the danger that the tin oxide will separate again from the solid solution phase. On the other hand, it is favorable for obtaining high densities to sinter at temperatures that are as high as possible. These sintering temperatures make an economic method possible. As is known, however, lower sintering temperatures can be compensated for with longer sintering times and vice versa. The indicated sintering temperatures are to be considered only as standard values inasmuch as identical sintering results can also be obtained, for example, with lower sintering temperatures but correspondingly longer sintering times.

In the following, the target according to the invention and the method for producing such a target are explained in greater detail with exemplified embodiments and with reference to the drawings.

Variation (1) of the Method for Producing Powder

For producing the starting powder, a metallic melt consisting of indium and tin was produced. The indium percentage and tin percentage, respectively, were controlled in such a manner that, in terms of the oxides, a weight percentage of 90% by weight of indium oxide and 10% by weight of tin oxide was obtained. The melt was atomized and at the same time partially oxidized in an atmosphere of 80% by volume of oxygen and 20% by volume of air. The ITO starting powder produced in this manner results as an oxidic solid solution with a weight percentage of approximately 97% which still contains a metallic phase. The oxidic portion of the powder exhibits a single-phase X-ray structure, namely, that of indium oxide; it has a sub-stoichiometric oxygen content of 17.2% (the stoichiometric oxygen content is approximately 17.4%). In the metallic phase of indium and tin, the indium percentage preponderates.

The powder particles all possess approximately the same degree of oxidation, however, it is possible that the metallic phase in the interior of the individual powder particles is enriched. The oxygen content of approximately 17.2% by weight corresponds to a sub-stoichiometric oxygen content. In a pure oxide mixture of this composition, the stoichiometric oxygen content is 17.7% by weight, and with solid solutions of this composition around 17.4% by weight.

The powder produced in this fashion has an average grain size of approximately 3 μm and its specific surface area measures approximately 0.3 $m^2/g$ according to the B.E.T. method.

Exemplified Embodiment for Producing the target

The starting powder produced in the above described manner was dried in a vacuum at approximately 400° C., then confined in a metal capsule which was evacuated. The powder was then hot isostatic-pressed at a pressure of 1,050 bar and at a temperature of 970° C. for a period of 3 hours.

The compact produced in this manner has a density of 98% of the theoretical density. No cracks or chips could be seen. The average grain size of the crystalline phase is 5 μm. It was easy to saw out several targets from the compact.

Comparison Example

A starting powder was produced according to the aforementioned method and subsequently oxidized in the air for 5 hours at 850° C. After the oxygen treatment, the starting powder had an oxygen content of approximately 17.4%. Based on powder diffractometric measurements, it was established that approximately 75% of the tin was present in the oxidic solid solution and that it had a stoichiometric oxygen content. From this it can be determined that for the solid solution powder treated in this manner, the oxygen content of 17.4% corresponds to the stoichiometric oxygen content.

The starting powder re-oxidized in this manner was hot isostatic-pressed at a pressure of 1,050 bar and at a temperature of 950° C. for a period of 3 hours.

However, only a compact with a density of 65% of the theoretical density and which exhibited cracks and chips could be produced.

Exemlified Embodiment for Producing the Target

The starting powder produced according to the above description was evacuated at 550° C. and at the same time degassed and, subsequently, hot isostatic-pressed at a pressure of 1,050 bar and at a temperature of 970° C. for a period of 3 hours. Thus, for this after-treatment of the powder, heavily oxidizing conditions were avoided. The compact produced in this manner had a density of 98% of the theoretical density. No cracks and chips could be seen. A similar result was obtained in a starting powder after-treatment under slightly reducing conditions.

Exemlified Embodiment for Producing the Target

A powder produced according to the first production method was, without any further preliminary treatment, hot isostatic-pressed at a pressure of 1,050 bar and at a temperature of 970° C. for a period of two hours.

A sample was taken from the ITO block produced in this manner and examined by X-ray diffraction as well as for its oxygen content. The X-ray diffractometrical measurement showed a single-phase structure having the lattice form of indium oxide. The oxygen was again at 17.2%.

Variation (2) of the Method for Producing Powder

For producing the starting powder, a metallic melt consisting of indium and tin was produced. The indium percentage and tin percentage, respectively, were controlled in such a manner that, in terms of the oxides, a weight percentage of 90% by weight of indium oxide and 10% by weight of tin oxide was obtained. The melt was atomized and at the same time partially oxidized in an atmosphere of 70% by volume of oxygen and 30% by volume of air.

The ITO starting powder produced in this manner results as an oxidic solid solution with a weight percentage of approximately 97% which still contains a metallic phase. The oxidic portion of the powder exhibits a single-phase X-ray structure, namely, that of indium oxide; it has a sub-stoichiometric oxygen content of 16.8%. In a pure oxide mixture of this composition, the stoichiometric oxygen content is at 17.7% by weight, and with solid solutions of this composition around 17.4% by weight. In the metallic phase of indium and tin, the indium percentage preponderates. The powder particles all possess approximately the same degree of oxidation, however, it is possible that the metallic phase in the interior of the individual powder particles is enriched.

The powder produced in this fashion has an average grain size of approximately 3 μm and its specific surface area measures approximately 0.3 m²/g according to the B.E.T. method.

Exemplified Embodiment for Producing the Target

A powder produced according to the above variation (2) of the method for producing powder was, without any further subsequent treatment, hot isostatic-pressed at a pressure of 1,050 bar and at a temperature of 970° C. for a period of three hours.

The block-type compact produced in this manner has a density of 98% of the theoretical density. Only very few cracks and chips could be seen which, furthermore, were limited to the border area. The block could be cut into several targets without any problems.

In FIG. 1, a measuring curve of a differential thermal analysis (DTA) of a solid solution powder of indium tin oxide (ITO powder) with the aforementioned composition of 90:10 is represented.

Starting with an oxide with a stoichiometric oxygen content, the powder was subsequently partially reduced in a forming gas (95% Ar, 5% H₂). To that extent, the reduction treatment corresponds to the subsequent reducing of the powder when sintering the target, as is known from the above mentioned method according to the state of the art. The oxygen content of the powder is about 16.8% by weight.

The DTA curve demonstrates a clear phase transformation at a temperature of 220° C. According to the In-Sn phase diagram, this phase transformation can be clearly correlated with the melting point of a metallic indium-tin alloy, whose tin content is approximately 90%. It is thus apparent that with a subsequent reduction treatment of oxidic ITO powder that has the aforementioned composition, primarily tin—and surely not indium—undergoes reduction, and, as a result, a metallic phase rich in tin is produced.

Figure 2:
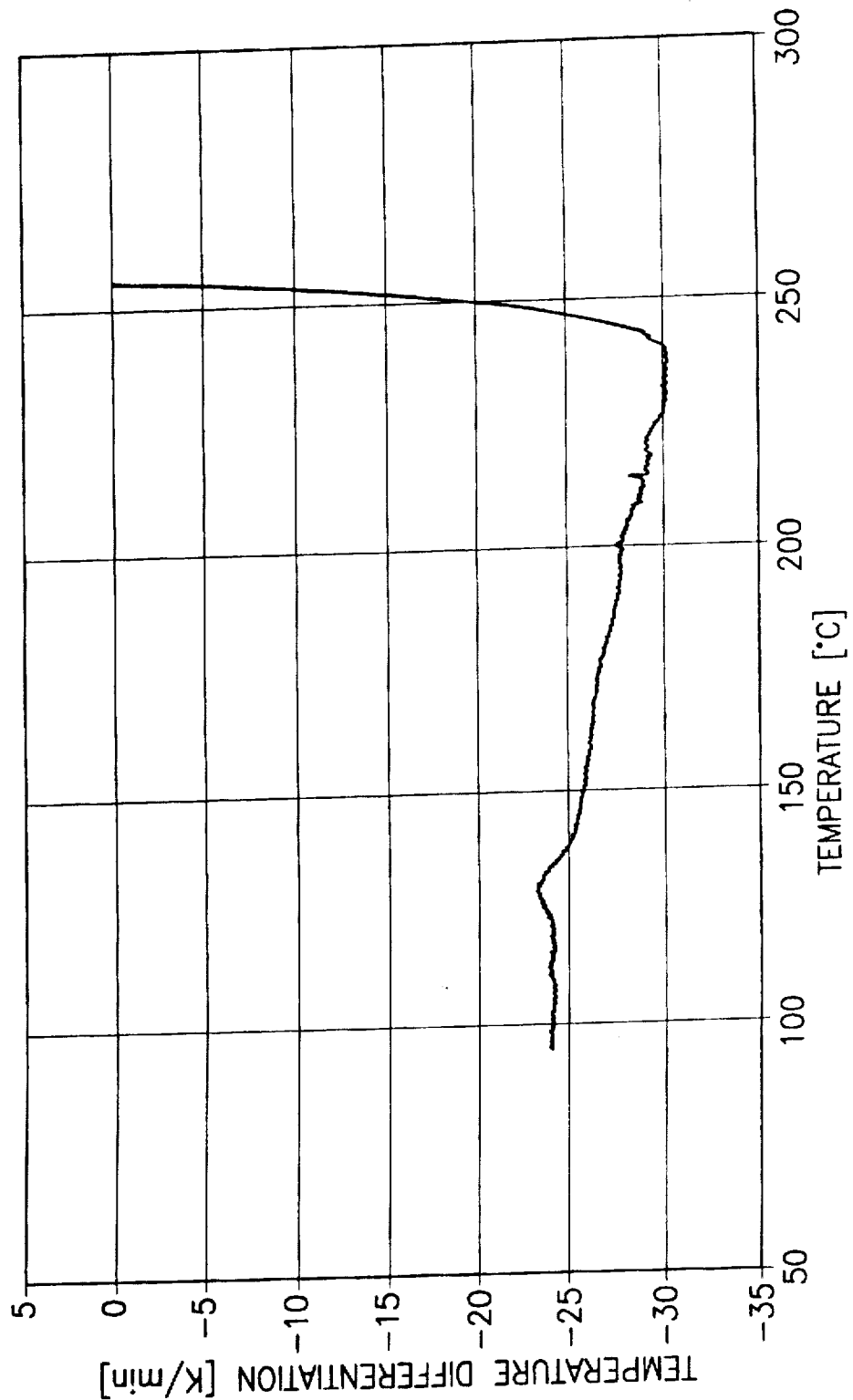
FIG. 2 is a differential thermal analysis (DTA) of not fully oxidized indium tin solid solution powder.

In FIG. 2, a measuring curve of a differential thermal analysis (DTA) of a starting powder produced through "co-oxidation" is represented. This powder is also a solid solution powder of indium tin oxide (ITO powder) with the composition of 90:10, which has been produced according to the above explained method (Variation (2) of the Method for Producing Powder) and which has an oxygen content of 16.8% by weight.

The DTA curve of this powder differs fundamentally from that of the subsequently reduced powder according to FIG. 1. A phase transformation at a temperature of approximately 120° C. can be seen. This temperature approximately corresponds to the melting temperature of the In-Sn eutectic mixture, which has a composition of approximately 51% by weight of indium and 49% by weight of tin. From the breadth of the temperature range through which the phase transformation can be seen, it can be concluded that in this case, the ITO powder has a metallic phase rich in indium whose percentage of indium can be as high as 80%. It is evident that such a composition of the metallic phase matches the composition of the oxidic phase substantially better than the composition of the metallic phase in the subsequently reduced powder. Thus, the individual chemical components of a target produced from this powder are distributed more homogeneously throughout the volume of the target.

It will be appreciated that the instant specification is set forth by way of illustration and not limitation, and that various modifications and changes may be made without departing from the spirit and scope of the present invention.

What is claimed is:

1. In a target for cathodic sputtering formed of hot-pressed or hot isostatic-pressed indium oxide/tin oxide powder with a minimum density of 95% of its theoretical density, and with a sub-stoichiometric oxygen content, the improvement wherein the target has a minimum of 90% by weight of a crystalline phase which is formed as a solid solution of indium oxide and tin oxide, and said powder has an average grain size ranging from 2 μm to 20 μm.

2. The target according to claim 1, wherein the crystalline phase has a minimum of 97% by weight of said solid solution.

3. The target according to claim 2, wherein the crystalline phase has the molecular lattice of indium oxide.

4. The target according to claim 3, wherein the solid solution phase is produced by hot-pressing or hot isostatic-pressing of indium oxide/tin oxide powder particles whose oxygen content decreases from the outside to the inside.

5. The target according to claim 4, wherein the powder particles have an oxidic outer skin which encloses a core of a metallic phase.

6. The target according to claim 5 wherein the powder particles have a metallic phase whose indium content is a minimum of 50% by weight.

7. The target according to claim 1, wherein the crystalline phase has the molecular lattice of indium oxide.

8. The target according to claim 1, wherein the solid solution phase is produced by hot-pressing or hot isostatic-pressing of indium oxide/tin oxide powder particles whose oxygen content decreases from the outside to the inside.

9. The target according to claim 8, wherein the powder particles have an oxidic outer skin which encloses a core of a metallic phase.

10. The target according to claim 9 wherein the powder particles have a metallic phase whose indium content is a minimum of 50% by weight.

11. In a method for producing a target of hot-pressed or hot isostatic-pressed indium oxide/tin oxide powder with a sub-stoichiometric oxygen content for cathodic sputtering, the method using a starting powder of indium oxide and tin oxide, and compressing the starting powder through hot-pressing or hot isostatic-pressing, the improvement wherein the starting powder is produced by sub-stoichiometrically oxidizing powdered indium tin metal to form an oxidic phase and the target has a minimum density of 95% of its theoretical density.

12. The method according to claim 11, wherein the starting powder is produced by atomizing an indium tin metal melt in an oxidizing atmosphere.

13. The method according to claim 11, wherein a starting powder is used which has a metal phase whose indium content is a minimum of 50% by weight up to about 90% by weight.

14. The method according to claim 11, wherein the starting powder has an average particle size ranging from 2 µm to 20 µm.

15. The method according to claim 14, wherein the oxidic phase of the particles of the starting powder has a crystalline solid solution phase.

16. The method according to claim 15, wherein the crystalline solid solution phase is present in the form of the molecular lattice of indium oxide.

17. The method according to claim 16, wherein the percentage of the solid solution phase is a minimum of 90% by weight, of the total weight of the starting powder.

18. The method according to claim 17, wherein the percentage of solid solution phase is a minimum of 97% by weight of the total weight of starting powder.

19. The method according to claim 15, wherein the percentage of the solid solution phase is a minimum of 90% by weight, of the total weight of the starting powder.

20. The method according to claim 19, wherein the percentage of solid solution phase is a minimum of 97% by weight of the total weight of starting powder.

21. The method according to claim 11, wherein the oxidic phase of the particles of the starting powder has a crystalline solid solution phase.

22. The method according to claim 21, wherein the crystalline solid solution phase has the molecular lattice of indium oxide.

* * * * *